(12) United States Patent
Han

(10) Patent No.: US 9,374,058 B2
(45) Date of Patent: Jun. 21, 2016

(54) IMPEDANCE MATCHING DEVICE AND METHOD

(71) Applicants: NOHSN CO., LTD., Jeollabuk-do (KR); Cheol-Min Han, Jeollabuk-do (KR)

(72) Inventor: Cheol-Min Han, Jeollabuk-do (KR)

( * ) Notice: Subject to any disclaimer, the term of this patent is extended or adjusted under 35 U.S.C. 154(b) by 7 days.

(21) Appl. No.: 14/401,523

(22) PCT Filed: Nov. 30, 2012

(86) PCT No.: PCT/KR2012/010325
§ 371 (c)(1),
(2) Date: Nov. 16, 2014

(87) PCT Pub. No.: WO2013/180360
PCT Pub. Date: Dec. 5, 2013

(65) Prior Publication Data
US 2015/0137905 A1    May 21, 2015

(30) Foreign Application Priority Data

Jun. 1, 2012    (KR) .................. 10-2012-0059309

(51) Int. Cl.
*H03H 7/40*    (2006.01)
*B06B 1/02*    (2006.01)
*G10K 11/34*    (2006.01)

(52) U.S. Cl.
CPC .............. *H03H 7/40* (2013.01); *B06B 1/0215* (2013.01); *B06B 2201/55* (2013.01); *B06B 2201/76* (2013.01); *G10K 11/341* (2013.01)

(58) Field of Classification Search
CPC ........................................ H03H 7/40
USPC ........................................ 333/17.3
See application file for complete search history.

(56) References Cited

U.S. PATENT DOCUMENTS

2009/0066440 A1*    3/2009    Chan Wai Po ............ H03F 1/56
333/32

FOREIGN PATENT DOCUMENTS

JP    2006-122193 A    5/2006
JP    2007-301160 A    11/2007
(Continued)

OTHER PUBLICATIONS

International Search Report for PCT/KR2012/010325, dated Feb. 28, 2013.

*Primary Examiner* — Stephen E Jones
*Assistant Examiner* — Scott S Outten
(74) *Attorney, Agent, or Firm* — Antonio Ha & U.S. Patent, LLC

(57) ABSTRACT

An impedance matching device includes a matching element array unit with a matching element array to which a transmission pulse and a received pulse pass, an extraction/calculation unit extracting pulse information from the transmission pulse and the received pulse, calculating impedance values corresponding to the pulse information, and calculating an impedance value having best response characteristics of the received pulse with respect to the transmission pulse as a matching impedance value, an array control unit routing the matching element array unit according to the matching impedance value, a first converter converting a frequency of the transmission pulse into a carrier frequency and outputting the transmission pulse to the matching element array unit, a second converter converting the carrier frequency into a low frequency, and a converter control unit outputting a signal for controlling the frequency converting of the first converter and the second converter.

9 Claims, 3 Drawing Sheets

(56) References Cited

FOREIGN PATENT DOCUMENTS

| KR | 10-2010-0118157 A | 11/2010 |
| KR | 10-2011-0092558 A | 8/2011 |
| KR | 10-1123221 B1 | 3/2012 |

* cited by examiner

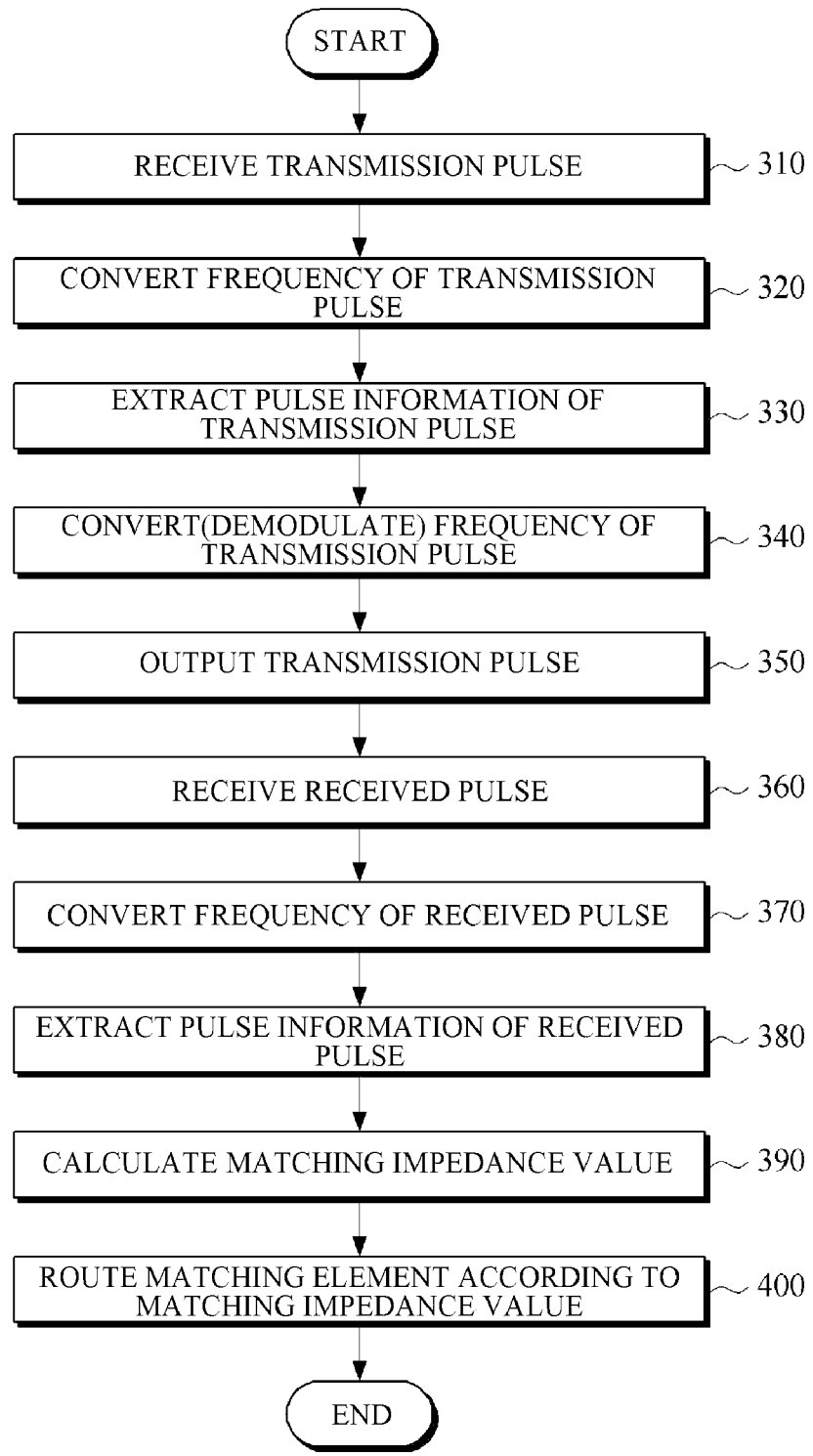

IMPEDANCE MATCHING DEVICE AND METHOD

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2012/0103259, filed 30 Nov. 2012, which claims priority to Korean Patent Application No. 10-2012-0059309, filed 1 Jun. 2012, entire contents of which are incorporated herein by reference.

TECHNICAL FIELD

The present invention relates to a field of data output of a semiconductor device, and more particularly, to control of variable impedance of an off-chip driver circuit that is positioned at a data output end of a semiconductor device and configured to provide internal data to an outside.

BACKGROUND ART

As an operating speed of electric products increases, a swing width of a signal that is interfaced between semiconductor devices decreases gradually. The reason is that a delay time taken in signal transmission needs to be minimized. However, as the swing width of the signal decreases, an influence of an external noise increases and also reflection of an output signal due to impedance mismatch at an interface stage becomes critical.

The impedance mismatch is caused by external noise, variation in a power source voltage, change in an operating temperature, and change in a manufacturing process. When the impedance mismatch occurs, high speed transmission of data may be difficult and data as an output signal that is output at a data output end of the semiconductor device may be distorted. Accordingly, when a semiconductor device at a receiving side receives the distorted output signal at an input end, problems such as a setup/hold fail or an input level decision error may frequently occur.

In order to apply an automatic impedance matching system, a technology for effectively integrating essential R-L-C is required. However, since an ultrasonic device uses a low frequency band of 20 to 40 MHz, passive elements have great values for integrating R-L-C and thus occupy large areas in a semiconductor. However, integration technology has limitations. Thus, it is difficult to implement element values that are variable for each channel on the board.

However, as systems are miniaturized, element values required for R-L-C matching are relatively reduced. Accordingly, if respective element values are reduced and determined an impedance matching function required thereto in a systematic situation between respective systems or nodes, performance of an entire system may be enhanced to the maximum extent possible.

The present invention is directed to providing an impedance matching device and method for effectively integrating R-L-C by adding a frequency converter to an input or output end of the impedance matching device.

One aspect of the present invention provides an impedance matching device comprising: a matching element array unit configured with a matching element array to which a transmission pulse and a received pulse pass, the transmission pulse being output from a system and the received pulse being the transmission pulse that is output to an outside and then reflected; an extraction/calculation unit extracting pulse information from the transmission pulse and the received pulse, calculating impedance values corresponding to the pulse information with respect to each of the transmission pulse and the received pulse, and calculating an impedance value having best response characteristics of the received pulse with respect to the transmission pulse as a matching impedance value; an array control unit routing the matching element array unit according to the matching impedance value; a first converter converting a frequency of the transmission pulse into a carrier frequency and outputting the carrier frequency to the matching element array unit; a second converter converting the carrier frequency output from the matching element array unit into a low frequency; and a converter control unit outputting a signal for controlling the frequency converting of the first converter and the second converter.

Another aspect of the present invention provides an impedance matching method comprising: converting a received transmission pulse into a predetermined carrier frequency to transmit the converted transmission pulse to a matching element array; extracting pulse information from the transmission pulse passing through the matching element array; converting the transmission pulse having passed through the matching element array from the carrier frequency to the original frequency to transmit the converted transmission pulse to an outside; receiving a received pulse corresponding to the transmission pulse; transmitting the received pulse to the matching element array configured to convert the received pulse into a carrier frequency; extracting pulse information from the received pulse passing through the matching element array; calculating a matching impedance value using the pulse information of the transmission pulse and the received pulse; and routing the matching element array through which the transmission pulse and the received pulse pass according to the matching impedance value.

The present invention can effectively integrate R-L-C elements that are essentially required for impedance matching to implement a programmable logic device (PLD) by adding a frequency converter to an input or output end of a source in order to reduce values of the R-L-C elements.

In addition, the present invention can overcome limitations of R-L-C integration technology for impedance matching between a probe and a system that operate in an existing ultrasonic sampling frequency range.

DESCRIPTION OF DRAWINGS

FIG. 3 is a flowchart illustrating an impedance matching method according to an embodiment of the present invention.

DETAILED DESCRIPTION

Figure 1:
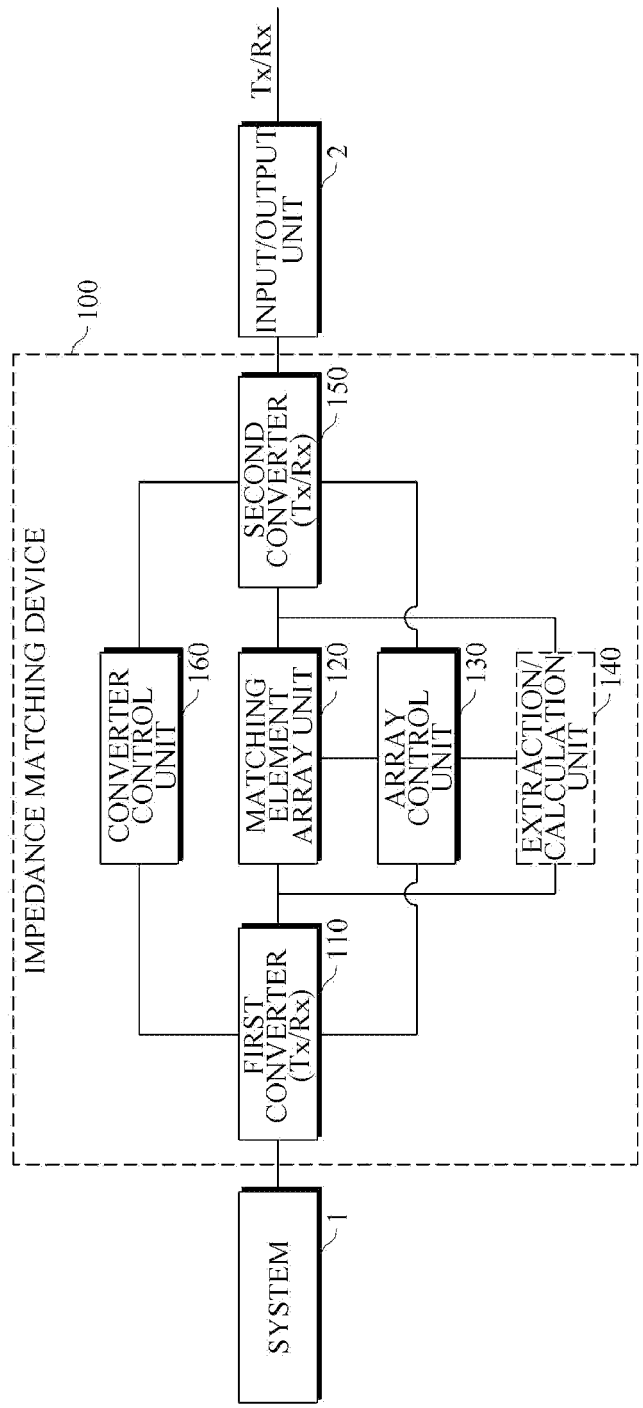
FIG. 1 is a block diagram of an impedance matching device according to an embodiment of the present invention.

While the invention is susceptible to various modifications and alternative forms, specific embodiments thereof are shown by way of example in the drawings and will herein be described in detail. However, it should be understood that the particular embodiments are not intended to limit the present disclosure to specific forms, but rather the present disclosure is meant to cover all modification, similarities, and alternatives which are included in the spirit and scope of the present disclosure.

Moreover, detailed descriptions related to well-known functions or configurations will be ruled out in order not to unnecessarily obscure subject matters of the present invention. It is also noted that, although ordinal numbers are used in the following description, they are used only to distinguish similar components.

It will be understood that when one element is referred to as "coupled" or "connected" with another element, the one element can be coupled or connected with the other element directly or via intervening elements if there is no specific limitation. Also, it will be understood that the meaning of "convert" includes "modulation" and/or "demodulation", the meaning of "converter" includes "modulator" and/or "demodulator".

Preferred embodiments of the present invention will be described below in more detail with reference to the accompanying drawings. In describing the invention, to facilitate the entire understanding of the invention, like numbers refer to like elements throughout the description of the figures.

FIG. 1 is a block diagram of an impedance matching device according to an embodiment of the present invention.

Figure 2:
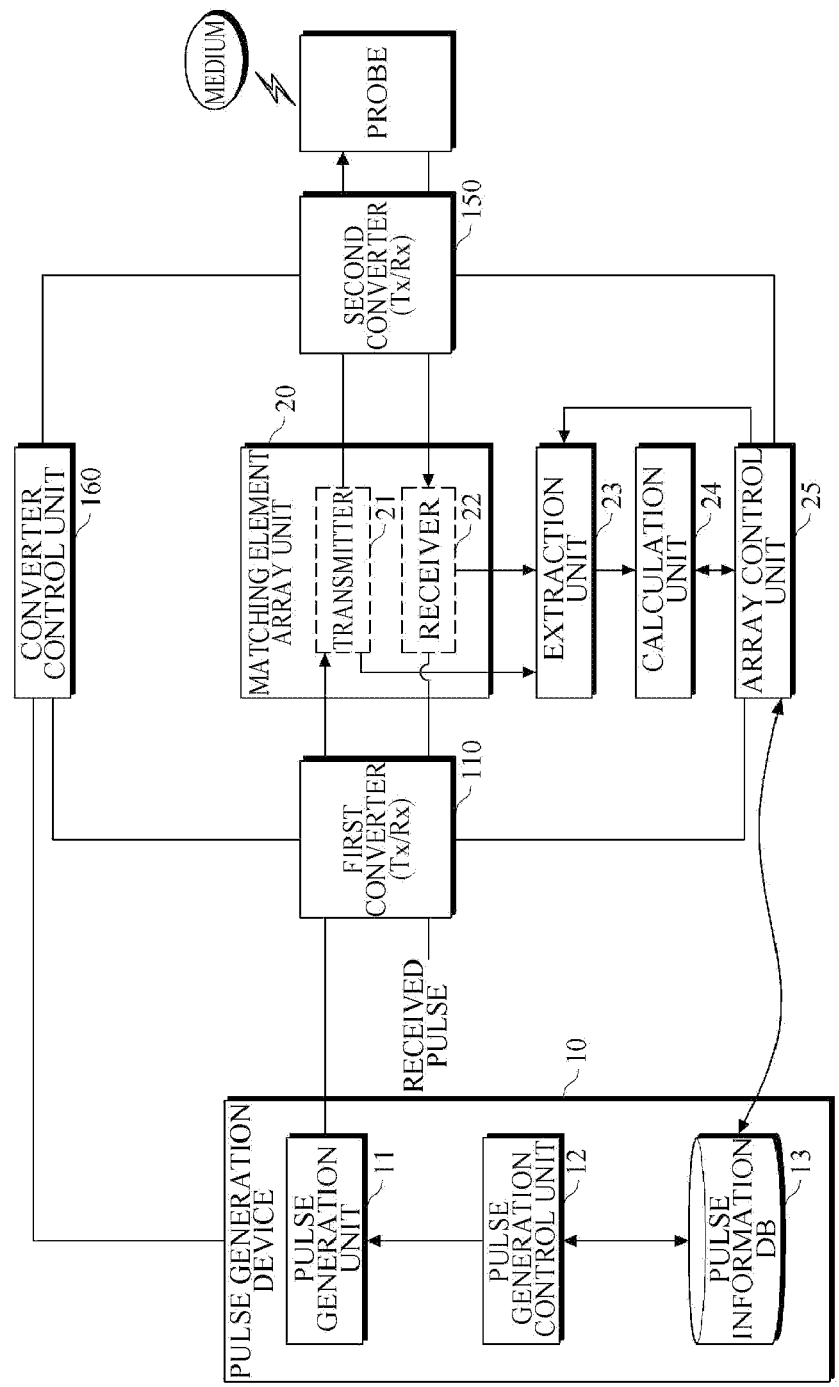
FIG. 2 is a block diagram showing an example in which the impedance matching device is applied to an ultrasonic system according to the present invention.

FIG. 2 is a block diagram showing an example in which the impedance matching device is applied to an ultrasonic system according to the present invention.

Referring to FIG. 1, an impedance matching device 100 is positioned between a system 1 and an input/output unit 2 and configured to perform impedance matching using a signal transmitted to the input/output unit 2 and a signal received from the input/output unit 2.

The system may be, as an example, a pulse generation device 10 of an ultrasonic system shown in FIG. 2, which generates a transmission pulse (Tx pulse) or a signal for diagnosis or treatment depending on a medium (for example, a body part intended for diagnosis or treatment).

A probe corresponding to the input/output unit 2 is a device for transmitting/receiving an internal/external signal or information. As an example, as shown in FIG. 2, the probe may be an ultrasonic probe that is configured to transmit an ultrasonic wave to a medium and receive an echo signal from the medium. In this case, the ultrasonic probe is configured as an array of elements (for example, a piezoelectric element, a sound wave generation element, etc.) for converting an electric signal into an ultrasonic wave, and the elements form an RF channel. For magnetic resonance imaging (MRI), the probe includes a coil, a receiving unit, and a circuit. In this case, the probe may include a first converter (modulator/demodulator) 150, and a position of a connector which is a circuit region included in the probe may be variable in accordance with a circuit configuration.

A probe 20 may include a transducer positioned inside the probe 20 and mutually converting an ultrasonic signal and an electric signal. In general, the transducer may include a group of a plurality of ultrasonic vibrators. For example, the probe 20 may convert a transmission pulse generated by the pulse generation device 10 into an ultrasonic signal, radiate an ultrasonic wave onto a diagnosis or treatment portion of a human body, convert a reflected ultrasonic signal into an electric signal, and transmit the electric signal to an image processing device (not shown). The image processing device may generate an image using the received signal. In this case, a characteristic impedance value for each channel of the probe 20 is determined according to production specification. In addition, the input/output unit 2 may be a coil and a receiving unit of MRI.

In a block diagram of an impedance matching system of FIG. 1, which is provided in the present invention, for an ultrasonic device, the pulse generation device and a second converter (modulator/demodulator) may be configured inside the probe. In order to enhance impedance matching characteristics, respective functional blocks may be positioned in a system or a probe end.

In the present invention, if a frequency of a pulse input to the impedance matching device 100 is low, L has a great value. Accordingly, the present invention increases impedance matching efficiencies of the system 1 and the input/output unit 2 by adding a carrier transmitter of a high frequency. The carrier transmitter performs a function for converting a frequency input to the impedance matching device 100 into a high frequency. Accordingly, as shown in FIG. 1 according to the present invention, respective converters 110 and 150 may be included in the input/output end of the impedance matching device 100.

Specifically, the impedance matching device 100 includes, a first converter 110, a matching element array unit 120, an array control unit 130, an extraction/calculation unit 140, a second converter 150, and a converter control unit 160.

The converter 110 or 150 is classified into the first converter 110 and the second converter 150, each of which performs a modulation or demodulation function according to Tx/Rx status, a carrier frequency variable function, and a channel grouping and degrouping function.

When the first converter 110 performs a Tx function, the first converter 110 performs the carrier frequency variable function and the modulation function in order to put pulse (or signal) information or system characteristic information (including probe information) provided by the system 1 on a carrier frequency according to information (control information and channel group information that are required to perform functions of the converters such as carrier frequency and modulation/demodulation control information) of the converter control unit 160. In this case, a Tx signal is transmitted on a carrier frequency of the first converter 110 through the matching element array unit 120. The second converter 150 demodulates Tx information transmitted on the carrier frequency and then transmits the demodulated Tx information to the input/output unit (probe) 2. When the first converter 110 and the second converter 150 perform a transmitting/receiving (Tx/Rx) function, channel group may be set for transmitting a signal on the carrier frequency then the signal may be transmitted to impedance matching element array unit 120.

When the first converter 110 performs an Rx operation in the matching element array unit 120, the first converter 110 functions to demodulate information received at the carrier frequency according to channel group setting information that is set by the converter control unit 160 and transmit the demodulated information to the system 1.

The first converter 110 and the second converter 150 may be marked as a carrier transmitter. The carrier transmitter may set a channel group of the input/output unit (probe) 2 according to the control information of the converter control unit 160. In this case, according to the number of channel groups that are set, the number of impedance matching elements may be changed. Each channel group may be controlled by the converter control unit 160 according to a transmission band, a transmission rate, an impedance characteristic, and system performance improvement requirements.

The converter control unit 160 performs a function for controlling the first converter 110 and the second converter 150 respectively and a control function for transmitting probe channel information independently or transmitting probe channel information by group setting when the carrier frequency is required to be fixed or variable appropriately for resources (for example, ultrasonic waves, electronic fields, etc.) of a diagnosis and treatment device and characteristics of a corresponding system.

As described above, the first converter 110 is connected to an output end of the system 1 and converts a frequency of a pulse signal output from the system 1 into a carrier frequency and then outputs the converted pulse signal. Then, a value of L of the matching element array unit 120 decreases.

The matching element array unit 120 is configured with an array of R-L-C impedance matching elements, and performs a function for matching the input/output unit (probe) 2 and the system 1 according to input information of the array control unit 130 through matrix switching. In this case, the impedance matching element array unit 120 performs an impedance matching function appropriately for the channel grouping information of the first converter 110 and the second converter 150, which are each a carrier transmitter. The array control unit 130 receives a matching impedance value from the extraction/calculation unit 140 that extracts and calculates state information and transmitted/received information of the first converter 110 and the second converter 150 and routes the matching element array of the matching element array unit 120 according to the received matching impedance value. For example, the array control unit 130 may determine a configuration and a connection relation of RLC elements according to the matching impedance value and generate a matrix code based on the configuration and connection relation. Next, the array control unit 130 may perform control such that the matching element array unit 120 routes the matching element array according to the matching impedance value by allowing the generated matrix code to be downloaded to the matching element array unit 120.

For ultrasonic waves, in general, impedance matching is performed by changing a value of L while fixing values of R and C. Furthermore, general impedance matching is performed with respect to each direction of power delivery and power output. However, for ultrasonic waves, since a transmission pulse line and a received pulse line are commonly used, an efficiency of pulse echo information for each channel is considered to be important, and also uniformity of all channels (pulse echo characteristics of respective channels are uniformly set) exerts a great influence on image characteristics.

In addition, the array control unit 130 may initialize the matching element array unit 120 before the system 1 generates a transmission pulse. For example, the array control unit 130 may route the matching element array of the matching element array unit 120 according to a predetermined fixed impedance value. Alternatively, the array control unit 130 may perform control such that the extraction/calculation unit 140 calculates an impedance value according to verified pulsed information and the matching element array is routed according to the calculated impedance value.

The extraction/calculation unit 140 extracts pulse information from the transmission pulse and the received pulse. For example, the extraction/calculation unit 140 may measure an amplitude, a phase, and a frequency of the transmission pulse and the received pulse that pass through the matching element array unit 120 and extract pulse information including a frequency response characteristic, a sensitivity, and a dynamic range of each channel from the calculated amplitude, phase, and frequency.

In addition, the extraction/calculation unit 140 receives the extracted pulse information of the transmission pulse and the received pulse and then calculates a matching impedance value. For example, the extraction/calculation unit 140 may calculate impedance values corresponding to amplitude information, phase information, and frequency information with respect to each of the transmission pulse and the received pulse and calculate an impedance value having a best response characteristic of the received pulse with respect to the transmission pulse as the matching impedance value. In general, for ultrasonic waves, a frequency response characteristic is good in a wide range that has a high sensitivity and a wide dynamic range and is centered on a center frequency.

The second converter 150 demodulates the carrier frequency output from the matching element array unit 120 to the original transmission pulse to output the demodulated transmission pulse to the input/output unit 2 and converts a signal received from the input/output unit 2 into the carrier frequency.

When the second converter 150 performs a Tx function, the second converter 150 demodulates a Tx signal (or information) from the carrier signal in the information received from the matching element array unit 120 according to the channel group information and the control information of the converter control unit 160 and delivers the demodulated Tx signal to the input/output unit (probe) 2.

When the second converter 150 performs an Rx function, the second converter 150 converts the information received from the input/output unit (probe) 2 according to the control information (carrier frequency, group setting, etc.) of the converter control unit 160 and then deliver the converted information to the impedance matching element array unit 120.

The converter control unit 160 is a control unit for controlling the first converter 110 and the second converter 150. The converter control unit 160 controls a carrier frequency of the first converter 110 and the second converter 150 according to characteristics (ultrasonic waves/MRI or medium characteristics, a loss ratio, and the like) of the system 1 and sets a channel group.

FIG. 3 is a flowchart illustrating an impedance matching method according to an embodiment of the present invention.

In step 310, the impedance matching device 100 receives a transmission pulse generated from the system 1. The generated transmission pulse is delivered to the input/output unit 2 through the matching element array unit 120 of the impedance matching device 100. When the transmission pulse is reflected by a medium and received through the input/output unit 2, the received pulse is delivered from the input/output unit 2 and received through the matching element array unit 120.

In this case, in step 320, the impedance matching device 100 converts the transmission pulse output by the system 1 into a carrier frequency and allows the converted transmission pulse to pass through the matching element array unit 120.

In step 330, the impedance matching device 100 extracts pulse information of the transmission pulse passing through the matching element array unit 120. That is, the impedance matching device 100 may measure an amplitude, a phase, and a frequency of the transmission pulse.

The impedance matching device 100 converts a carrier frequency to the transmission pulse that may be output to the input/output unit 2 in step 340 and outputs the transmission pulse in step 350.

And then, the input/output unit 2 output the transmission pulse to a medium and then receives and outputs a received pulse reflected from the medium.

The impedance matching device 100 receives the received pulse output from the input/output unit 2 in step 360 and converts a frequency of the received pulse into a carrier frequency and passes the converted received pulse through the matching element array unit 120 in step 370.

In step 380, the impedance matching device 100 extracts pulse information of the received pulse passing through the matching element array unit 120. That is, the impedance matching device 100 may measure an amplitude, a phase, and a frequency of the received pulse.

In step 390, the impedance matching device 100 calculates a matching impedance value using the extracted pulse information of the transmission pulse and the received pulse. For example, the impedance matching device 100 may calculate impedance values corresponding to amplitude information, phase information, and frequency information with respect to each of the transmission pulse and the received pulse and calculate a impedance value having a best response characteristic of the received pulse with respect to the transmission pulse as the matching impedance value.

In step 400, the impedance matching device 100 may route the matching element array of the matching element array unit 120 according to the calculated matching impedance value.

For example, the impedance matching device 100 may determine a configuration and a connection relation of RLC elements according to the matching impedance value and generate a matrix code based on the configuration and connection relation. Next, the impedance matching device 100 may route the matching element array of the matching element array unit 120 according to the matching impedance value by allowing the generated matrix code to be downloaded to the matching element array unit 120.

The impedance matching method according to an embodiment of the present invention may be implemented as program instructions executable by a means that can electronically process a variety of information and recorded on a storage medium. Here, the storage medium may include a program instruction, a data file, a data structure, or a combination thereof.

The program instruction recorded on the storage medium may be designed and configured specifically for the present invention or can be publicly known and available to those who are skilled in the field of computer software. Examples of the storage medium include a magnetic medium, such as a hard disk, a floppy disk, and a magnetic tape, an optical medium, such as a CD-ROM, a DVD, etc., a magneto-optical medium such as a floptical disk, and a hardware device, such as a ROM, a RAM, a flash memory, etc. specially configured to store and perform program instructions. In addition, the storage medium may be a transmission medium such as an optical or metallic line or a waveguide, including a carrier for transmitting signals to indicate program instructions, a data structure, etc. Examples of the program instructions include not only machine language codes made by a compiler but also high-level language codes executable by a device for electronically processing information, such as computer, by using an interpreter.

The above exemplary hardware device can be configured to operate as one or more software modules in order to perform the operation of the present invention, and vice versa.

The invention claimed is:

1. An impedance matching device comprising:
a first converter converting a frequency of a transmission pulse into a carrier frequency and then outputting the transmission pulse to the matching element array unit;
a second converter converting the carrier frequency of the transmission pulse having passed through the matching element array unit to the original frequency, converting a frequency of a received pulse being the transmission pulse that is output to an outside and then reflected into a carrier frequency, and then outputting the received pulse to the matching element array unit;
a matching element array unit through which a transmission pulse and a received pulse pass; and
an extraction/calculation unit extracting pulse information from the transmission pulse and the received pulse passing through the matching element array unit, and calculating matching impedance values using the pulse information.

2. The impedance matching device of claim 1, further comprising a converter control unit controlling the first converter and the second converter and setting channel group information.

3. The impedance matching device of claim 2, wherein the first converter and the second converter convert a frequency of the transmission pulse and the received pulse according to the setting channel group information.

4. The impedance matching device of claim 1, further comprising an array control unit routing the matching element array unit according to the matching impedance value.

5. The impedance matching device of claim 4, wherein the array control unit determines a configuration and a connection relation of matching elements according to the matching impedance value, generates a matrix code based on the configuration and connection relation, and downloads the matrix code to the matching element array unit to route the matching element array unit.

6. The impedance matching device of claim 1, wherein the pulse information comprises an amplitude, a phase, and a frequency of the transmission pulse and the received pulse.

7. The impedance matching device of claim 1, wherein the extraction/calculation unit calculates impedance values corresponding to the pulse information with respect to each of the transmission pulse and the received pulse, and calculates an impedance value having best response characteristics of the received pulse with respect to the transmission pulse as the matching impedance value.

8. The impedance matching device of claim 1, wherein the matching element array unit is a programmable device having a matching element array integrated thereto.

9. An impedance matching method comprising:
converting a frequency of a transmission pulse into a carrier frequency;
outputting the transmission pulse to a matching element array unit;
extracting pulse information from the transmission pulse passing through the matching element array unit;
converting the carrier frequency of the transmission pulse having passed through the matching element array unit to the original frequency to transmit the transmission pulse having the original frequency to an outside;
receiving a received pulse corresponding to the transmission pulse from the outside;
converting a frequency of the received pulse into a carrier frequency;
outputting the received pulse to the matching element array unit;
extracting pulse information from the received pulse passing through the matching element array unit; and
calculating matching impedance values using the pulse information of the transmission pulse and the received pulse.

* * * * *